(12) United States Patent
Maejima et al.

(10) Patent No.: US 7,558,117 B2
(45) Date of Patent: Jul. 7, 2009

(54) NONVOLATILE SEMICONDUCTOR MEMORY DEVICE (75) Inventors: Hiroshi Maejima, Milpitas, CA (US); Makoto Hamada, Mountain View, CA (US)

(73) Assignee: Kabushiki Kaisha Toshiba, Tokyo (JP)

( * ) Notice: Subject to any disclaimer, the term of this patent is extended or adjusted under 35 U.S.C. 154(b) by 131 days.

(21) Appl. No.: 11/847,854

(22) Filed: Aug. 30, 2007

(65) Prior Publication Data

US 2009/0059670 A1  Mar. 5, 2009

(51) Int. Cl.
*G11C 16/04* (2006.01)
(52) U.S. Cl. ............... 365/185.18; 365/185.21; 365/185.22
(58) Field of Classification Search ............ 365/185.18, 365/185.2, 185.21, 185.22, 210, 211
See application file for complete search history.

(56) References Cited

U.S. PATENT DOCUMENTS

| | | | | |
|---|---|---|---|---|
| 6,839,281 | B2 * | 1/2005 | Chen et al. | 365/185.21 |
| 6,907,497 | B2 * | 6/2005 | Hosono et al. | 711/103 |
| 7,420,846 | B2 * | 9/2008 | Chen et al. | 365/185.22 |
| 2006/0133150 | A1 | 6/2006 | Shibata | |

OTHER PUBLICATIONS

U.S. Appl. No. 12/211,947, filed Sep. 17, 2008, Nishihara et al.

* cited by examiner

*Primary Examiner*—Gene N. Auduong
(74) *Attorney, Agent, or Firm*—Oblon, Spivak, McClelland, Maier & Neustadt, P.C.

(57) ABSTRACT

There is provided a nonvolatile semiconductor memory device which can read and verify a cell with a negative threshold voltage by biasing voltages of a source line and well line to a positive voltage. The nonvolatile semiconductor memory device includes a voltage control circuit which applies a select gate voltage obtained by adding the biased positive voltage to a voltage set at read time of a cell with a positive threshold voltage to a select gate at a read time and verify time for the cell with the negative threshold voltage.

20 Claims, 8 Drawing Sheets

NONVOLATILE SEMICONDUCTOR MEMORY DEVICE

BACKGROUND OF THE INVENTION

1. Field of the Invention

This invention relates to a nonvolatile semiconductor memory device and more particularly to a NAND flash memory in which data can be read out from cells with negative threshold voltages, for example.

2. Description of the Related Art

A NAND flash memory is well known in the art as a nonvolatile semiconductor memory device in which data can be electrically rewritten (written and erased) and which is suitably formed with high integration density and large memory capacity. In the NAND flash memory, the voltages of select gates are instantly raised to approximately 4V at the start time of the read operation in the conventional read system (read system for cells with positive threshold voltages (positive potential read)/Positive Level Sense system) in which the voltages of a source line and well line are set to 0V.

On the other hand, in the read system for cells with negative threshold voltages (negative potential read)/Negative Level Sense system), the voltages of a source line and well line are biased to a positive voltage (for example, 1V) at the read time (for example, refer to U.S. Patent Application Publication No. 2006/0133150 A1). That is, in the case of a NAND flash memory in which cells with a negative threshold voltages are present, the voltage of a selected word line (WL) is set to approximately 0V (the voltages of non-selected word lines are set to approximately 6V) by writing multivalue data (for example, data of eight or more values/data of three or more bits). In this state, the voltages of the source line and well line are biased to a positive voltage. As a result, the read and verify operations for the cell with the negative threshold voltage can be performed.

Thus, in recent years, a study is made to stably perform the read and verify operations for the cell with the negative threshold voltage by biasing the voltages of the source line and well line to the positive voltage at the read time and verify time. However, in the case of the NAND flash memory in which the voltage of the select gate is set to 4V at the read time for the cell with the positive threshold voltage, it is necessary to set 4V or more as the voltage of the select gate at the read time and verify time for the cell with the negative threshold voltage. However, an effective method for controlling the voltage of the select gate in the read and verify operations for the cell with the negative threshold voltage is not yet provided.

As described above, in the NAND flash memory, an attempt is made to perform the read and verify operations for the cell with the negative threshold voltage. It is therefore desired to develop an effective voltage control circuit that controls the voltage of the select gate at the read time and verify time for the cell with the negative threshold voltage so that the read and verify operations for the cell with the negative threshold voltage can be stably performed.

BRIEF SUMMARY OF THE INVENTION

According to a first aspect of the present invention, there is provided a nonvolatile semiconductor memory device capable of reading and verifying a cell with a negative threshold voltage by biasing voltages of a source line and well line to a positive voltage, comprising a voltage control circuit which applies a select gate voltage obtained by adding the biased positive voltage to the voltage set at a read time of a cell with a positive threshold voltage to a select gate at a read time and verify time for the cell with the negative threshold voltage.

According to a second aspect of the present invention, there is provided a nonvolatile semiconductor memory device capable of reading and verifying a cell with a negative threshold voltage by biasing voltages of a source line and well line to a positive voltage, comprising a voltage control circuit which applies a select gate voltage obtained by adding the biased positive voltage to a voltage set at a read time of a cell with a positive threshold voltage to a select gate at a read time and verify time for the cell with the negative threshold voltage, wherein the voltage control circuit raises the voltage of the select gate in at least two separate steps.

DETAILED DESCRIPTION OF THE INVENTION

Embodiments of the present invention will be described with reference to the accompanying drawings. It should be noted that the drawings are schematic ones and the dimensional ratios shown therein are different from the actual ones. The dimensions vary from drawing to drawing and so do the ratios of the dimensions. The following embodiments are directed to a device and a method for embodying the technical concept of the present invention and the technical concept does not specify the material, shape, structure or configuration of components of the present invention. Various changes and modifications can be made to the technical concept without departing from the spirit or scope of the claimed invention.

First Embodiment

Figure 1:
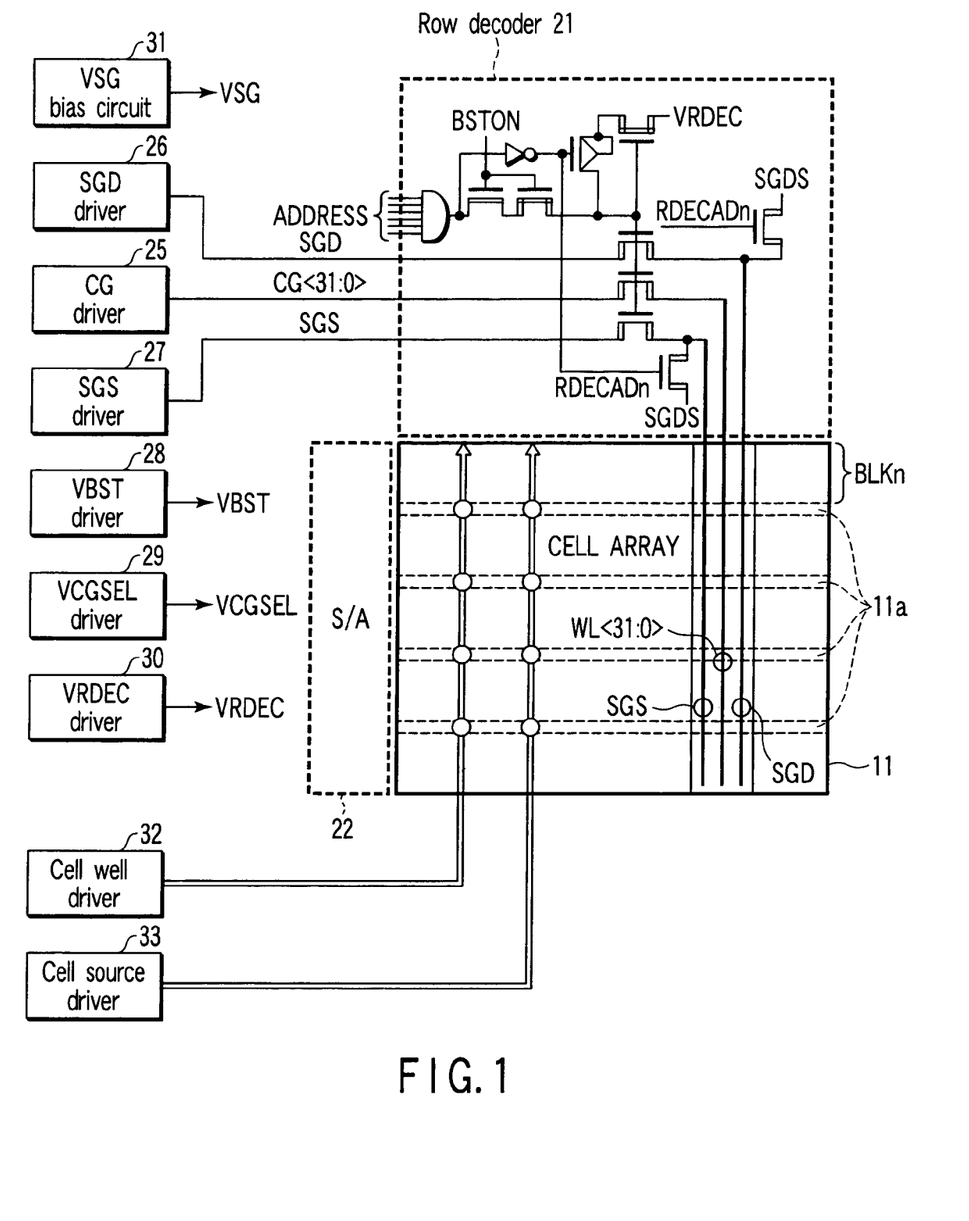
FIG. 1 is a block diagram showing an example of the configuration of a NAND flash memory according to a first embodiment of this invention.

FIG. 1 shows the basic configuration of a nonvolatile semiconductor memory device according to a first embodiment of this invention. In the present embodiment, a case wherein a NAND flash memory having memory cells each of which includes a MOS (Metal Oxide Semiconductor) transistor having a double gate (stacked gate) structure is taken as an example is explained. Further, a case wherein an entire bit line selection sense system is used is explained.

As shown in FIG. 1, the memory chip includes a core section and peripheral circuit section. In the core section, a memory cell array 11, row decoder section 21, sense amplifier section 22 and the like are provided. In the peripheral circuit section, for example, a CG driver 25, SGD driver 26, SGS driver 27, VBST driver 28, VCGSEL driver 29, VRDEC driver 30 and VSG bias circuit 31 are provided to control the row decoder section 21. In addition, in the peripheral circuit section, a cell well driver 32 and cell source driver 33 are provided.

In FIG. 1, a core control and drive section, column decoder section, address circuit, high-voltage generation circuit, input/output (I/O) circuit and control circuit are omitted for the sake of convenience.

The memory cell array 11 has a plurality of NAND cells (memory cell transistors) and, for example, stores multivalue data (write data) of eight or more values or three bits or more for each cell transistor in a nonvolatile fashion. The cell transistor is used as a cell with a positive or negative threshold voltage according to the write state (level). The memory cell array 11 is explained in detail later.

The row decoder section 21 receives a block selection signal (ADDRESS) from the address circuit and selects a block corresponding to the block selection signal in the memory cell array 11. Then, it supplies adequate voltages corresponding to the operation to word lines (WL<31:0>) of the selected block. Further, it supplies an adequate voltage corresponding to the operation to select gates (selection transistors SGTD, SGTS) of the selected block.

The sense amplifier section 22 has a plurality of sense amplifiers (S/A) and reads a state (stored data) of a selected cell transistor.

The cell well driver 32 controls the voltage of the cell well line via a shunt area 11a in the memory cell array 11. The cell well driver 32 biases the voltage of the cell well line to a positive voltage (for example, 1V) at the read time for a cell with the negative threshold voltage (Negative potential read time/Negative level read time).

The cell source driver 33 drives the cell source line (SRC) via the shunt area 11a in the memory cell array 11. The cell source driver 33 biases the voltage of the cell source line SRC to a positive voltage (for example, 1V) at the read time for a cell with the negative threshold voltage.

The core control and drive section controls the core section of the memory chip and is a driver circuit that supplies a control signal (control bias BSTON) corresponding to the operation and adequate voltage (SGDS) corresponding to the operation to the memory cell array 11, row decoder section 21 and sense amplifier section 22.

The column decoder section controls the connection between a data line (not shown) and a column (sense amplifier S/A) selected in the memory cell array 11 according to a column selection signal from the address circuit. It transfers read data and write data between the input/output circuit and the sense amplifier S/A.

The address circuit generates a block selection signal and column selection signal according to the operation and address information input from the exterior of the chip and supplies the block selection signal and column selection signal to the row decoder section 21 and column decoder section, respectively.

The high-voltage generation circuit includes a charge pump circuit and causes the charge pump circuit to generate a voltage corresponding to the operation and supply the same to the core control and drive section in response to an instruction from the control circuit. For example, the high-voltage generation circuit generates voltages VPGM, VPGMH, VUSEL, VCGRV, VREADH and VSGD. The voltage VPGM is a program voltage and is a voltage applied to the selected word line at the program (write) operation time. The voltage VPGMH is a voltage that can be used to transfer the voltage VPGM by use of a level shifter. The voltage VUSEL is used as the voltage VPASS at the program operation time and used as the VREAD at the read operation time and verify time (both of the voltages VPASS and VREAD are voltages applied to the non-selected word lines at the respective operation times). The voltage VCGRV is a voltage applied to the selected word line at the read operation time and verify time. The voltage VREADH is a voltage that can be used to transfer the voltage VREAD by use of a level shifter. The voltage VSGD is a voltage of approximately 2.5V applied to the SGD driver 26.

The input/output circuit fetches a command, address information and write data input from an I/O pad (not shown) of the chip at the program operation time in response to an instruction from the control circuit and respectively outputs the command, address information and write data to the control circuit, address circuit and data line. Further, at the read operation time, it outputs read data on the data line to the I/O pad according to an instruction from the control circuit.

The control circuit controls the core control and drive section, address circuit, high-voltage generation circuit and input/output (I/O) circuit in response to a control signal input from the exterior of the chip. Further, it controls local pumps (SWVPP or SWVPASS) and level shifters (LSTP or LSHVX) in the CG driver 25, SGD driver 26, SGS driver 27, VBST driver 28, VCGSEL driver 29 and VRDEC driver 30 and VSG bias circuit 31.

In this case, write data is written into the cell transistor and acts as storage data and the storage data is read out from the cell transistor and used as read data.

Figure 2:
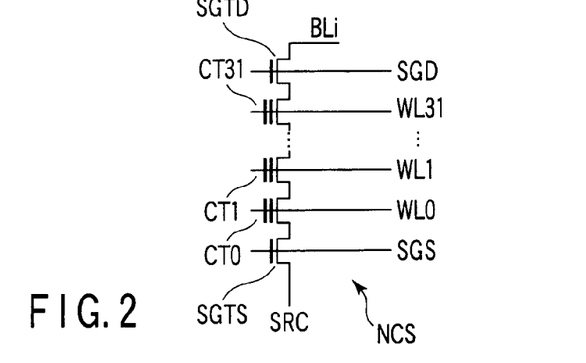
FIG. 2 is a configuration diagram of a NAND cell string in a memory cell array of the NAND flash memory shown in FIG. 1.

FIG. 2 shows a configuration example of the memory cell array 11. In the case of the present embodiment, for example, each NAND cell string (NAND string) NCS is configured by 32 memory cell transistors CT (CT<31:0>) serially connected and selection transistors SGTD and SGTS connected to the two ends of the series-connected circuit. The NAND string NCS is a constituent unit of the memory cell array 11. Each of the memory cell transistors CT is configured by a MOS transistor having a double gate structure. Word lines WL (WL<31:0>) are respectively connected to the control gate electrodes CG (CG<31:0>) of the memory cell transistors CT.

The selection transistors SGTD connected to one-side ends of the NAND strings NCS are selectively connected to respective bit lines BLi. A selection signal line SGD is commonly connected to the gate electrodes of the selection transistors SGTD. The selection transistors SGTS connected to the other ends of the NAND strings NCS are commonly connected to the cell source line SRC. A selection signal line SGS is commonly connected to the gate electrodes of the selection transistors SGTS. The word lines WL and selection signal lines SGD, SGS are connected to the row decoder section 21. The bit lines BLi are connected to the sense amplifier S/A. A block (one unit) BLKn is configured by m NAND strings NCS commonly using the word lines WL and selection signal lines SGD, SGS.

That is, n blocks BLK are provided in the memory cell array 11. In each of the blocks BLKn, m NAND strings NCS commonly using the bit line BLi are provided. The m NAND strings NCS of each block BLKn commonly use the word lines WL (WL<31:0>) and selection signal lines SGD, SGS.

The data write and erase operations are performed by injecting or discharging electrons with respect to the floating gate of the selected memory cell transistor CT by use of an FN tunnel current.

Figure 3:
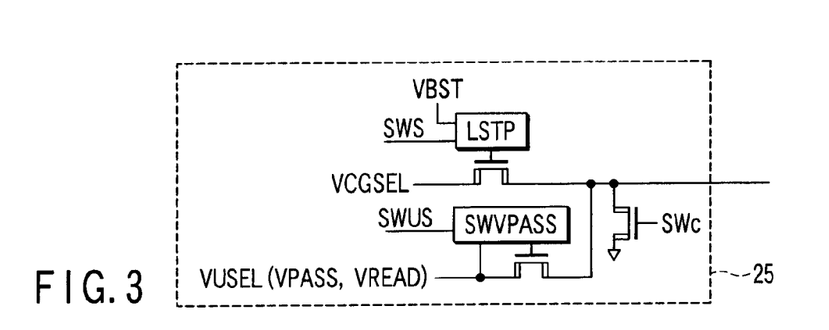
FIG. 3 is a configuration diagram of a CG driver of the NAND flash memory shown in FIG. 1.

FIG. 3 shows a configuration example of the CG driver 25. The output signals CG<31:0> of the CG driver 25 are used as common input signals to each of the row decoders of the blocks BLKn. In the selected block, the transfer gate of a corresponding one of the row decoders is turned ON and the output signals CG<31:0> are supplied to the word lines WL (WL<31:0>). That is, the CG driver 25 applies voltage VCGSEL from the high-voltage generation circuit to the selected word line and applies voltage VUSEL (voltage VPASS or voltage VREAD) to the other word lines or non-selected word lines WL. Since the transfer gates of the corresponding row decoders are turned OFF in the non-selected blocks, the output signals CG<31:0> are not supplied to the word lines WL (WL<31:0>).

Figure 4:
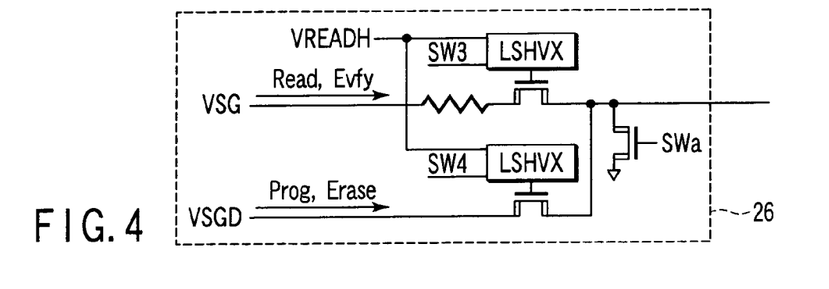
FIG. 4 is a configuration diagram of an SGD driver of the NAND flash memory shown in FIG. 1.

FIG. 4 shows a configuration example of the SGD driver 26. The SGD driver 26 applies select gate voltage VSG from the VSG bias circuit 31 to the selection transistor SGTD at the read operation time and erase-verify time and applies voltage VSGD from the high-voltage generation circuit to the selection transistor SGTD at the program operation time and erase operation time.

Figure 5:
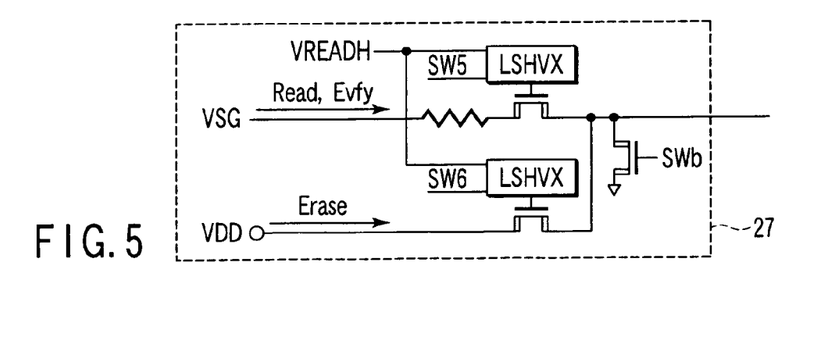
FIG. 5 is a configuration diagram of an SGS driver of the NAND flash memory shown in FIG. 1.

FIG. 5 shows a configuration example of the SGS driver 27. The SGS driver 27 applies select gate voltage VSG from the VSG bias circuit 31 to the selection transistor SGTS at the read operation time and erase-verify time and applies voltage VDD to the selection transistor SGTS at the erase operation time.

Figure 6:
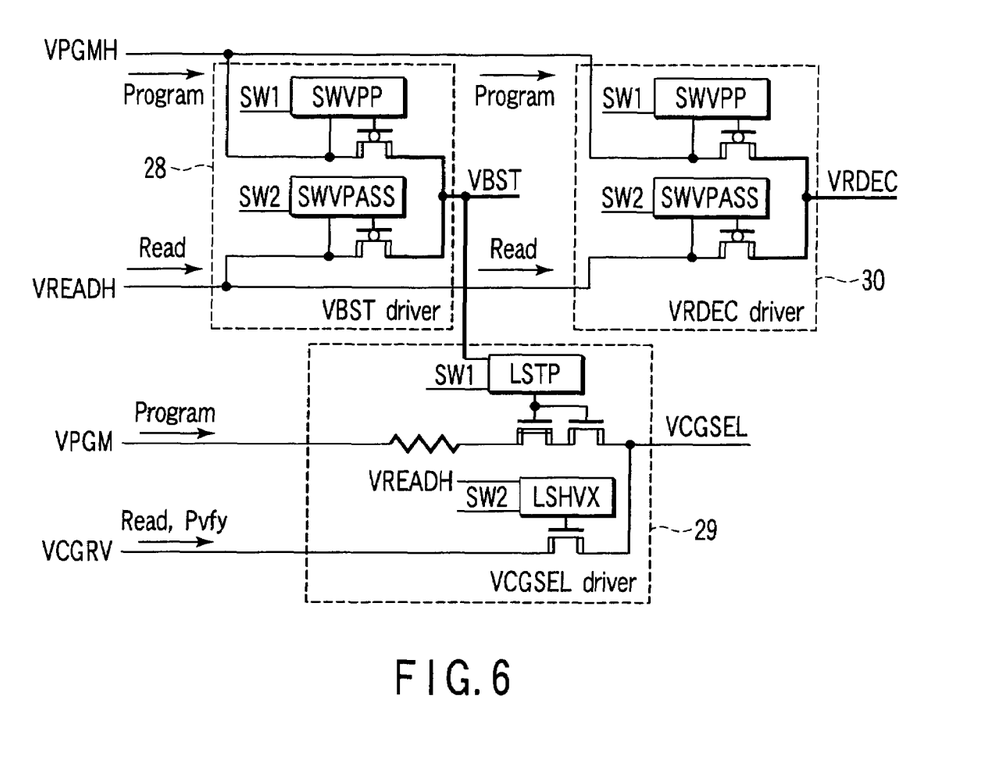
FIG. 6 is a configuration diagram of a VBST driver, VCG-SEL driver and VRDEC driver of the NAND flash memory shown in FIG. 1.

FIG. 6 shows a configuration example of the VBST driver 28, VCGSEL driver 29 and VRDEC driver 30.

The VBST driver 28 outputs voltage VPGMH from the high-voltage generation circuit at the program time and outputs voltage VREADH from the high-voltage generation circuit at the read time as voltage VBST. The output voltage VBST is set to a voltage that is sufficient to transfer the voltage VCGSEL and is supplied to the level shifter LSTP of each of the CG driver 25 and VCGSEL driver 29.

The VCGSEL driver 29 outputs program voltage VPGM from the high-voltage generation circuit at the program time and outputs voltage VCGRV from the high-voltage generation circuit at the read time as voltage VCGSEL. The output voltage VCGSEL is used as a voltage applied to the selected word line WL.

The VRDEC driver 30 outputs voltage VPGMH from the high-voltage generation circuit at the program time and outputs voltage VREADH from the high-voltage generation circuit at the read time as voltage VRDEC. The output voltage VRDEC is applied to the row decoder section 21.

Figure 7:
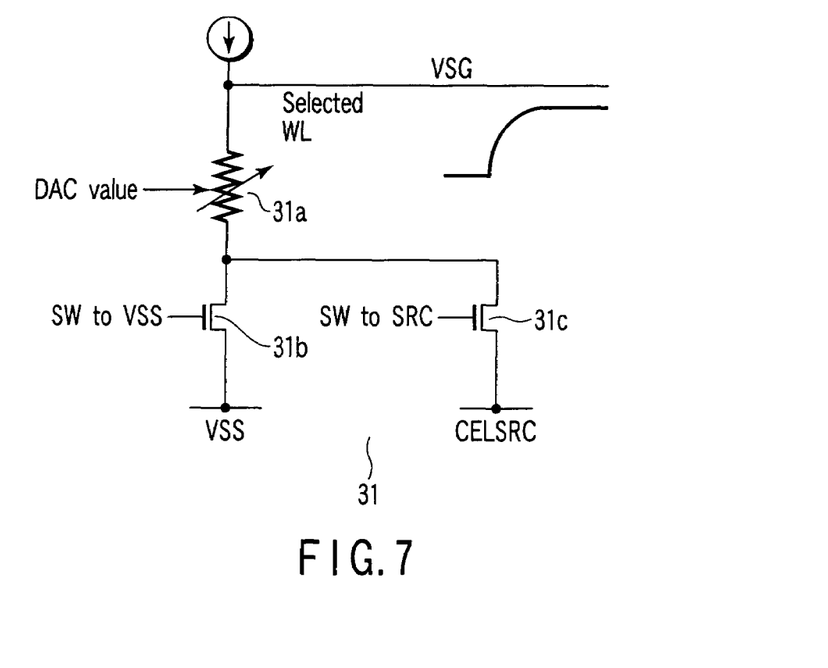
FIG. 7 is a configuration diagram of a VSG bias circuit of the NAND flash memory shown in FIG. 1.

FIG. 7 shows a configuration example of the VSG bias circuit 31. The VSG bias circuit 31 generates select gate voltage VSG. The select gate voltage VSG generated by the VSG bias circuit 31 is finally supplied to the selection transistors SGTD, SGTS of the memory cell array 11 via the SGD driver 26 and SGS driver 27.

For example, a voltage of approximately 4V (select gate voltage VSG) is instantly applied to the selection transistors SGTD, SGTS at the read time of a cell with the positive threshold voltage (positive potential read time/Positive level read time) by controlling a variable resistor 31a according to a DAC value from the control circuit (the source node is set at the voltage VSS). Further, a select gate voltage VSG of approximately 5V (which is obtained by adding the bias voltage of the cell source line SRC to the select gate voltage VSG at the read time of the cell with the positive threshold voltage) is finally applied to the selection transistors SGTD, SGTS at the read time of a cell with the negative threshold voltage, for example.

When the read operation for the cell with the negative threshold voltage is performed, the selection transistors SGTD, SGTS are precharged in at least two separate steps. For example, first, a select gate voltage VSG of approximately 4V is applied to the selection transistors SGTD, SGTS so as to set the voltages of the selection transistors SGTD, SGTS to a voltage lower than the final level voltage (in this example, 5V). Then, after the voltages of the cell well line and cell source line SRC are raised, a select gate voltage VSG of approximately 5V is applied to the selection transistors SGTD, SGTS so as to set the voltages of the selection transistors SGTD, SGTS to the final level voltage. Thus, the voltages of the selection signal lines SGD, SGS are finally raised to the final level voltage of approximately 5V by performing the second-step precharging operation. In this case, in order to prevent occurrence of a read disturb, it is preferable to set the select gate voltage VSG first applied to the selection transistors SGTD, SGTS to substantially the same voltage (in this example, 4V) as the select gate voltage VSG used for the ordinary read operation.

In the case of the present embodiment, for example, the circuit configuration in which switching transistors 31b, 31c controlled by the control circuit are provided in the VSG bias circuit 31 is made and can generate select gate voltage VSG to which actual cell source line voltage CELSRC is added as a bias voltage to a voltage set a read time of a cell with a positive threshold voltage by changing the source node voltage to the cell source line voltage CELSRC at the read time of the cell with the negative threshold voltage. That is, in order to eliminate the temperature dependency of the cell transistor CT at the read time of the cell with the negative threshold voltage, it is considered to provide the temperature dependency for the cell source line voltage CELSRC. With the VSG bias circuit 31, the select gate voltage VSG can be automatically set to follow the cell source line voltage CELSRC having the temperature dependency.

Figure 8A:
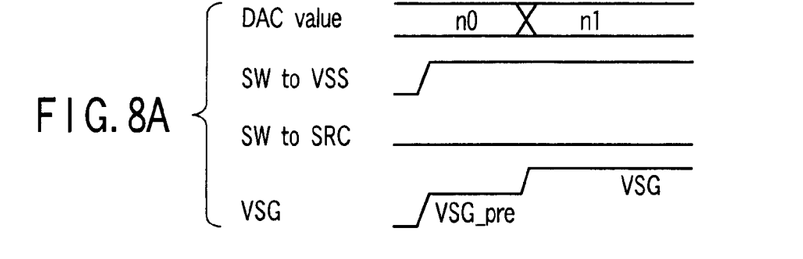
FIGS. 8A and 8B are timing charts each for illustrating the operation at the read time of a cell with a negative threshold voltage of the VSG bias circuit shown in FIG. 7.
Figure 8B:
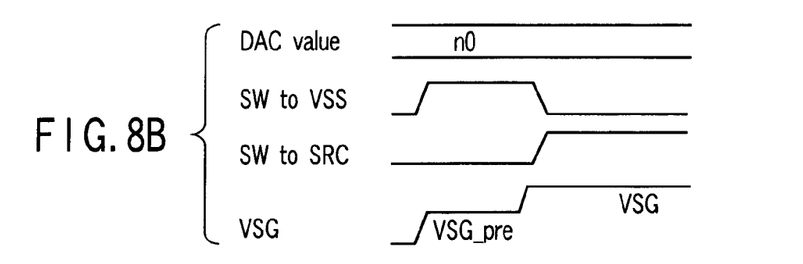

FIGS. 8A and 8B each show the operation of the VSG bias circuit 31 at the read time of the cell with the negative threshold voltage. FIG. 8A shows an example in which the selection transistors SGTD, SGTS are precharged in two separate steps by changing the DAC value. In this case, the source node is fixed at the voltage VSS and the select gate voltage VSG is changed in the two steps (VSG_pre, VSG) by changing the DAC value (n0/n1).

FIG. 8B shows an example in which the selection transistors SGTD, SGTS are precharged in two separate steps by changing the source node voltage. In this case, the DAC value is fixed at n0 and the select gate voltage VSG is changed in the two steps (VSG_pre, VSG) by changing the source node voltage from the voltage VSS to the cell source line voltage CELSRC by use of the switching transistors 31b, 31c.

Figure 9A:
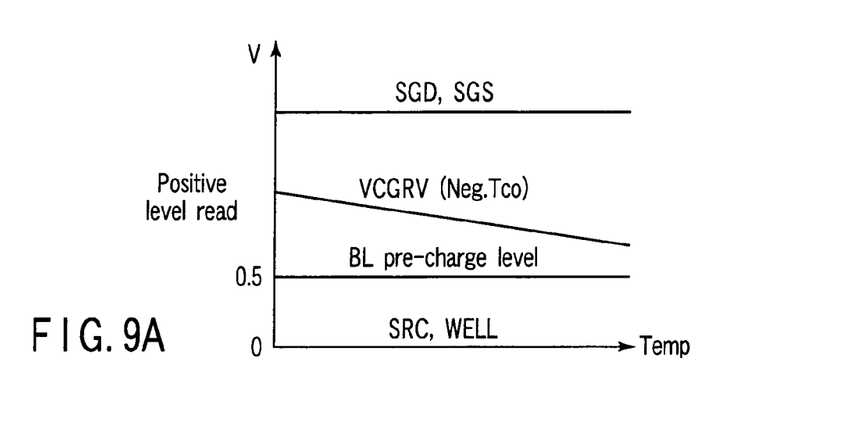
FIG. 9A is a diagram for illustrating the temperature dependency of the read operation for a cell with a positive threshold voltage and FIG. 9B is a diagram for illustrating the temperature dependency of the read operation for a cell with a negative threshold voltage.
Figure 9B:
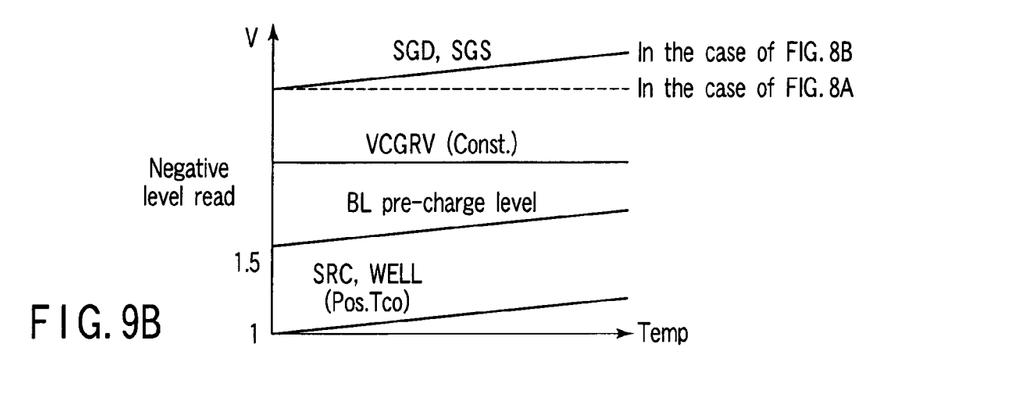

FIGS. 9A and 9B show the temperature dependencies of the cell well line WELL and cell source line SRC at the read time of the cell with the positive threshold voltage and at the read time of the cell with the negative threshold voltage. FIG. 9A shows the temperature dependency at the read time of the cell with the positive threshold voltage and FIG. 9B shows the temperature dependency at the read time of the cell with the negative threshold voltage.

As is clearly understood from the drawing, the cell well line WELL and cell source line SRC each have the temperature dependency at the read time of the cell with the negative threshold voltage. Therefore, when the selection transistors SGTD, SGTS are precharged by changing the source node voltage to the cell source line voltage CELSRC (refer to FIG. 8B), it is possible to cause the selection signal lines SGD, SGS to have the same temperature dependency. That is, the voltage (select gate voltage VSG) of the selection signal lines SGD, SGS can be linked to the voltage of the cell well line WELL and the voltage CELSRC of the cell source line SRC.

Next, the operation of controlling the select gate voltage in the cell read and verify operation of the NAND flash memory is explained.

Figure 10:
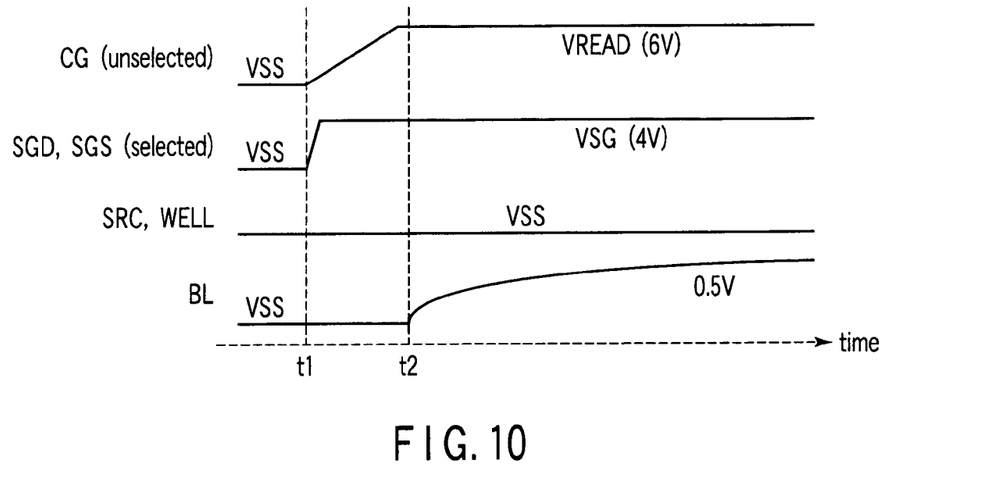
FIG. 10 is a timing chart for illustrating an operation associated with the read operation for a cell with a positive threshold voltage.

FIG. 10 shows an operation associated with the read operation for the cell with positive threshold voltage. Generally, in the read operation for the cell with the positive threshold voltage, the voltage of the cell well line WELL and the voltage CELSRC of the cell source line SRC are set to the voltage VSS (0V) by use of the cell well driver 32 and cell source driver 33. Further, at timing t1, the VSG bias circuit 31 instantly raises the voltages of the selection signal lines SGD, SGS set in the selected state from the voltage VSS by use of the select gate voltage VSG of approximately 4V via the SGD driver 26 and SGS driver 27.

At the timing t1, the CG driver 25 gradually raises the voltage of the non-selected word lines WL (control gate electrodes CG) to the voltage VREAD of approximately 6V. Then, at timing t2 after the voltage of the non-selected word lines WL is completely raised, the sense amplifier 22 starts the precharge operation so as to finally set the voltage of the bit line BL to approximately 0.5V. Thus, the operation of reading the cell with a positive threshold voltage is performed by the entire bit line selection sense system.

Figure 11:
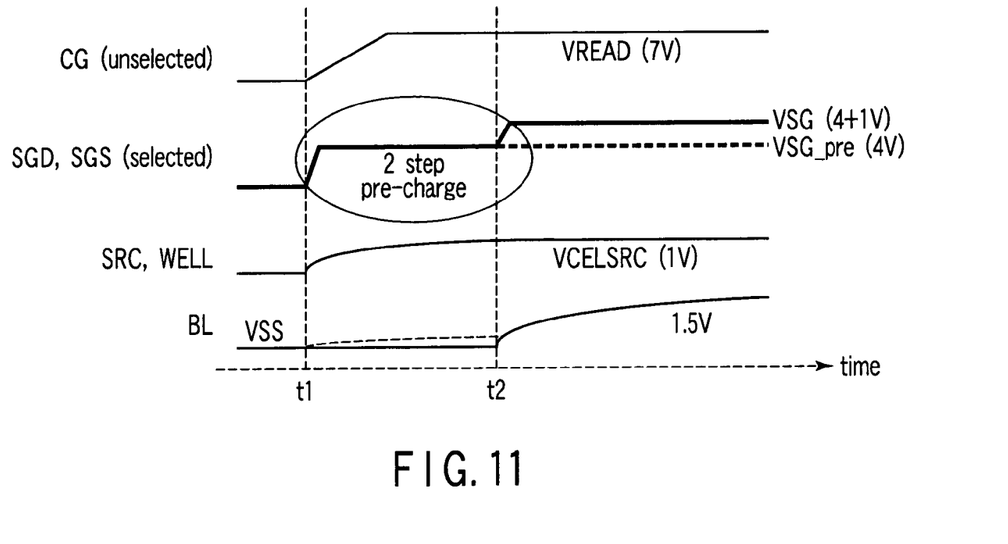
FIG. 11 is a timing chart for illustrating an operation associated with the read and verify operations for a cell with a negative threshold voltage.

FIG. 11 illustrates an operation associated with the read and verify operations for the cell with the negative threshold voltage to bias the voltages of the cell source line SRC and cell well line WELL to a positive voltage. In this example, the operation associated with the read operation for the cell with the negative threshold voltage is explained.

In the read operation for the cell with the negative threshold voltage, first, at timing t1, the voltage of the cell well line WELL is biased to voltage VCELSRC (for example, 1V) by the cell well driver 32. Likewise, the voltage CELSRC of the cell source line SRC is biased to the voltage VCELSRC (for example, 1V) by the cell source driver 33. Further, at the timing t1, the CG driver 25 gradually raises the voltage of the non-selected word lines WL (control gate electrodes CG) to the voltage VREAD of approximately 7V obtained by adding the bias voltages (in this example, 1V) of the cell source line SRC and cell well line WELL (the voltage of the selected word line WL is 0V).

At the timing t1, the VSG bias circuit 31 raises the voltages of the selection signal lines SGD, SGS in the selected state by use of the select gate voltage VSG_pre of approximately 4V via the SGD driver 26 and SGS driver 27 in the first-step precharge operation. Then, at timing t2 after the voltages of the cell source line SRC and cell well line WELL are completely raised, the VSG bias circuit 31 performs the second-step precharge operation to set the voltages of the selection signal lines SGD, SGS to the final level. That is, the VSG bias circuit 31 further raises the voltages of the selection signal lines SGD, SGS in the selected state by use of the select gate voltage VSG of approximately 5V obtained by adding the bias voltage (in this example, 1V) of the cell source line SRC and cell well line WELL.

At the timing t2, the sense amplifier section 22 starts the precharge operation to finally set the voltage of the bit line BL to approximately 1.5V. Thus, the operation of reading the cell with the negative threshold voltage is performed by the entire bit line selection sense system.

As described above, at the read time and verify time for the cell with the negative threshold voltage, the selection transistors SGTD, SGTS are precharged in at least two separate steps. That is, in the case of the read operation for the cell with the negative threshold voltage in which the voltages of the cell source line SRC and cell well line WELL are biased to the positive voltage, it is necessary to apply select gate voltage VSG that is higher than the voltage set at the read time for the cell with the a positive threshold voltage and is obtained by adding the bias voltage of the cell source line SRC to the select gate voltage at the read time for the cell with the positive threshold voltage to the selection transistors SGTD, SGTS. However, if the high select gate voltage (in this case, 5V) VSG is applied to the selection transistors SGTD, SGTS in a state in which the voltages of the cell source line SRC and cell well line WELL are not sufficiently raised, there occurs a possibility that the gate oxide films of the selection transistors SGTD, SGTS will be destroyed by high-voltage stress. On the other hand, if the voltages of the selection transistors SGTD, SGTS are raised in a state in which the voltages of the cell source line SRC and cell well line WELL are sufficiently raised, there occurs a problem that read disturb occurs. That is, in the case of the entire bit line selection sense system, at the read time and verify time for the cell with the negative threshold voltage, the select gate voltage VSG cannot be instantly raised to the final level voltage at the start time of the operation and it is necessary to control the timing of raising and the select gate voltage.

Therefore, for example, the voltages of the selection transistors SGTD, SGTS are raised by use of the select gate voltage VSG_pre that is the same as the select gate voltage VSG at the read time for the cell with the positive threshold voltage until the voltages of the cell source line SRC and cell well line WELL are completely raised. After this, the voltages of the selection transistors SGTD, SGTS are further raised until the final level voltage is attained in a state in which the voltages of the cell source line SRC and cell well line WELL are sufficiently raised. As a result, the voltages of the selection transistors SGTD, SGTS can be stably raised without destroying the gate oxide films of the selection transistors SGTD, SGTS or causing the read disturb. Therefore, the stable read operation and verify operation for the cell with the negative threshold voltage can be realized.

Particularly, the precharge operation for the selection transistors SGTD, SGTS is performed in the two steps and the voltages of the selection signal lines SGD, SGS are raised by use of the select gate voltage VSG_pre that is the same as the select gate voltage VSG at the read time for the cell with the positive threshold voltage in the first-step precharge operation. Thus, the read operation and verify operation for the cell with the negative threshold voltage can be realized in a shorter period of time.

In the first embodiment explained above, a case wherein the selection transistors SGTD, SGTS are precharged in the two separate steps at the read time and verify time for the cell with the negative threshold voltage is explained. However, this invention is not limited to this case and, for example, the read operation and verify operation for the cell with the negative threshold voltage can be realized when the voltages of the selection signal lines SGD, SGS are instantly raised.

Figure 12:
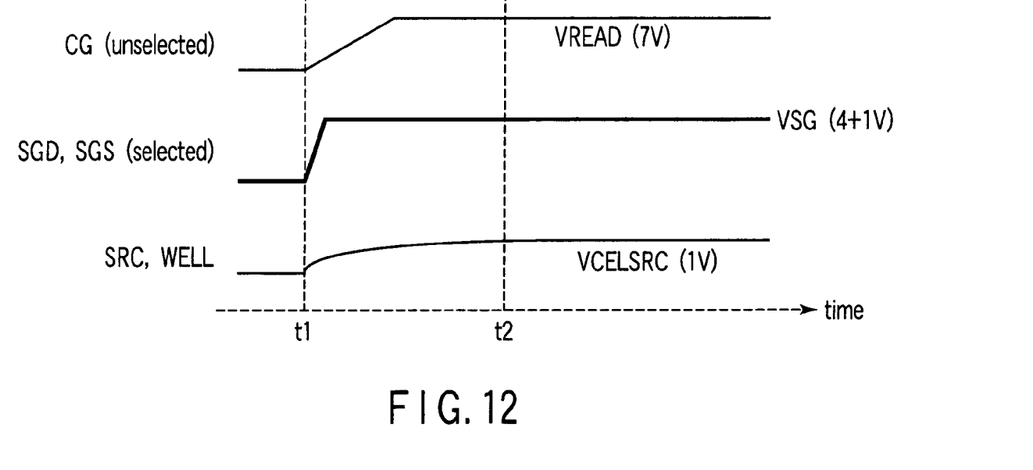
FIG. 12 is a timing chart for illustrating another operation associated with the read and verify operations for a cell with a negative threshold voltage.

FIG. 12 shows an example of a case wherein the voltages of the selection signal lines SGD, SGS are instantly raised at the start time of the read operation in the read operation for the cell with the negative threshold voltage. That is, at timing t1, the VSG bias circuit 31 instantly raises the voltages of the selection signal lines SGD, SGS in the selected state to the select gate voltage VSG of approximately 5V that is set as a final level via the SGD driver 26 and SGS driver 27. In this example, if the gate oxide films of the selection transistors SGTD, SGTS can be highly resistant to high-voltage stress, the stable read operation for the cell with the negative threshold voltage can be realized without precharging the selection transistors SGTD, SGTS in two separate steps.

Figure 13:
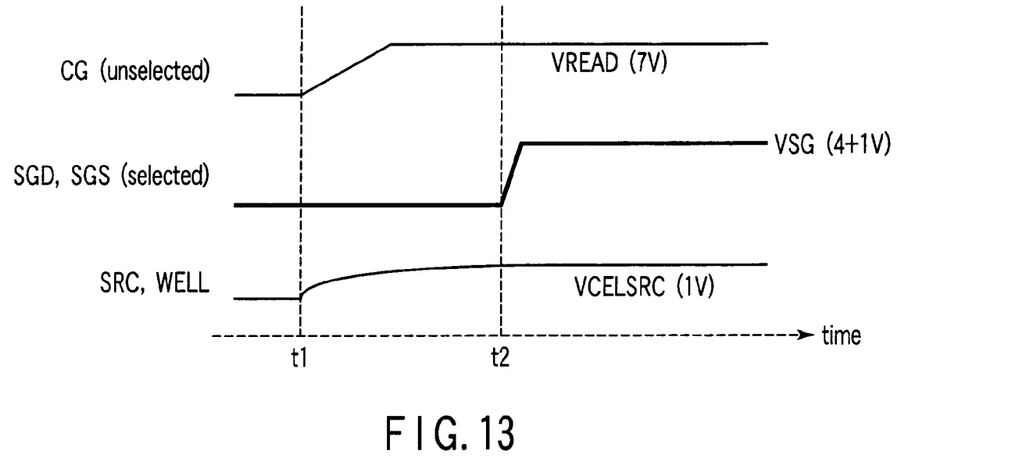
FIG. 13 is a timing chart for illustrating still another operation associated with the read and verify operations for a cell with a negative threshold voltage.

FIG. 13 is shows an example of a case wherein the voltages of the selection signal lines SGD, SGS are instantly raised after the voltages of the cell well line WELL and cell source line SRC are raised in the read operation for the cell with the negative threshold voltage. That is, at timing t2, the VSG bias circuit 31 instantly raises the voltages of the selection signal lines SGD, SGS in the selected state to the select gate voltage VSG of approximately 5V that is set as a final level via the SGD driver 26 and SGS driver 27. In this example, if the influence by occurrence of a read disturb is sufficiently small, the stable read operation for the cell with the negative threshold voltage can be realized without precharging the selection transistors SGTD, SGTS in two separate steps.

Second Embodiment

Figure 14:
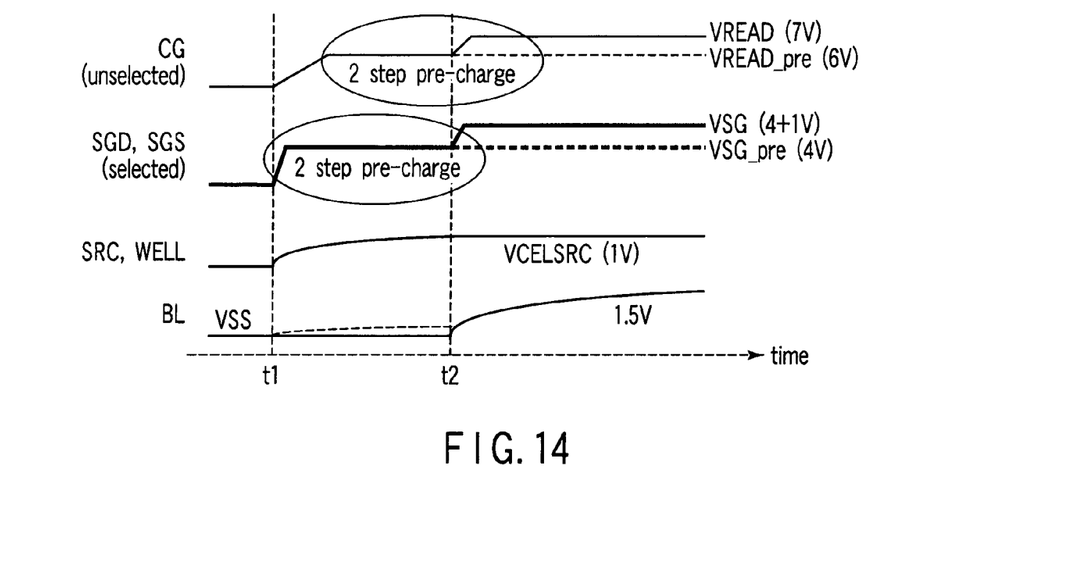
FIG. 14 is a timing chart for illustrating an operation associated with the read and verify operations for a cell with a negative threshold voltage according to a second embodiment of this invention.

FIG. 14 illustrates an operation associated with the read and verify operations for a cell with a negative threshold voltage according to a second embodiment of this invention. In the case of the present embodiment, the voltages of a cell source line SRC and cell well line WELL are biased to a positive voltage. At the read time and verify time for the cell with the negative threshold voltage, word lines WL (control gate electrodes CG) are precharged in two separate steps at substantially the same time of the precharge operation for selection transistors SGTD, SGTS. In the following description, the operation associated with the read operation for the cell with the negative threshold voltage in the NAND flash memory with the configuration shown in the first embodiment is explained below as an example.

That is, in the read operation for the cell with the negative threshold voltage, first, at timing t1, the voltage of the cell well line WELL is biased to voltage VCELSRC (for example, 1V) by a cell well driver 32. Likewise, the voltage CELSRC of the cell source line SRC is biased to the voltage VCELSRC (for example, 1V) by a cell source driver 33.

Further, at the timing t1, a VSG bias circuit 31 first raises the voltages of selection signal lines SGD, SGS in the selected state by use of a select gate voltage VSG_pre of approximately 4V via an SGD driver 26 and SGS driver 27 in the first-step precharge operation. Then, at timing t2 after the voltages of the cell source line SRC and cell well line WELL are completely raised, the VSG bias circuit 31 performs the second-step precharge operation to set the voltages of selection signal lines SGD, SGS to a final level. That is, the VSG bias circuit 31 further raises the voltages of selection signal lines SGD, SGS in the selected state by use of a select gate voltage VSG of approximately 5V attained by adding the bias voltage (in this case, 1V) of the cell source line SRC and cell well line WELL.

Further, at the timing t1, a CG driver 25 raises the voltage of non-selected word lines WL to voltage VREAD_pre of approximately 6V in the first-step precharge operation. Then, at the timing t2, the CG driver 25 performs the second-step precharge operation to set the voltage of the non-selected word lines WL to a final level. That is, the CG driver 25 further raises the voltage of the non-selected word lines WL to voltage VREAD of approximately 7V obtained by adding the bias voltage (in this case, 1V) of the cell source line SRC and cell well line WELL (the voltage of the selected word line WL is 0V).

At the timing t2, a sense amplifier section 22 starts the precharge operation to finally set the voltage of the bit line BL to approximately 1.5V. Thus, the operation of reading the cell with the negative threshold voltage is performed by the entire bit line selection sense system.

Figure 15:
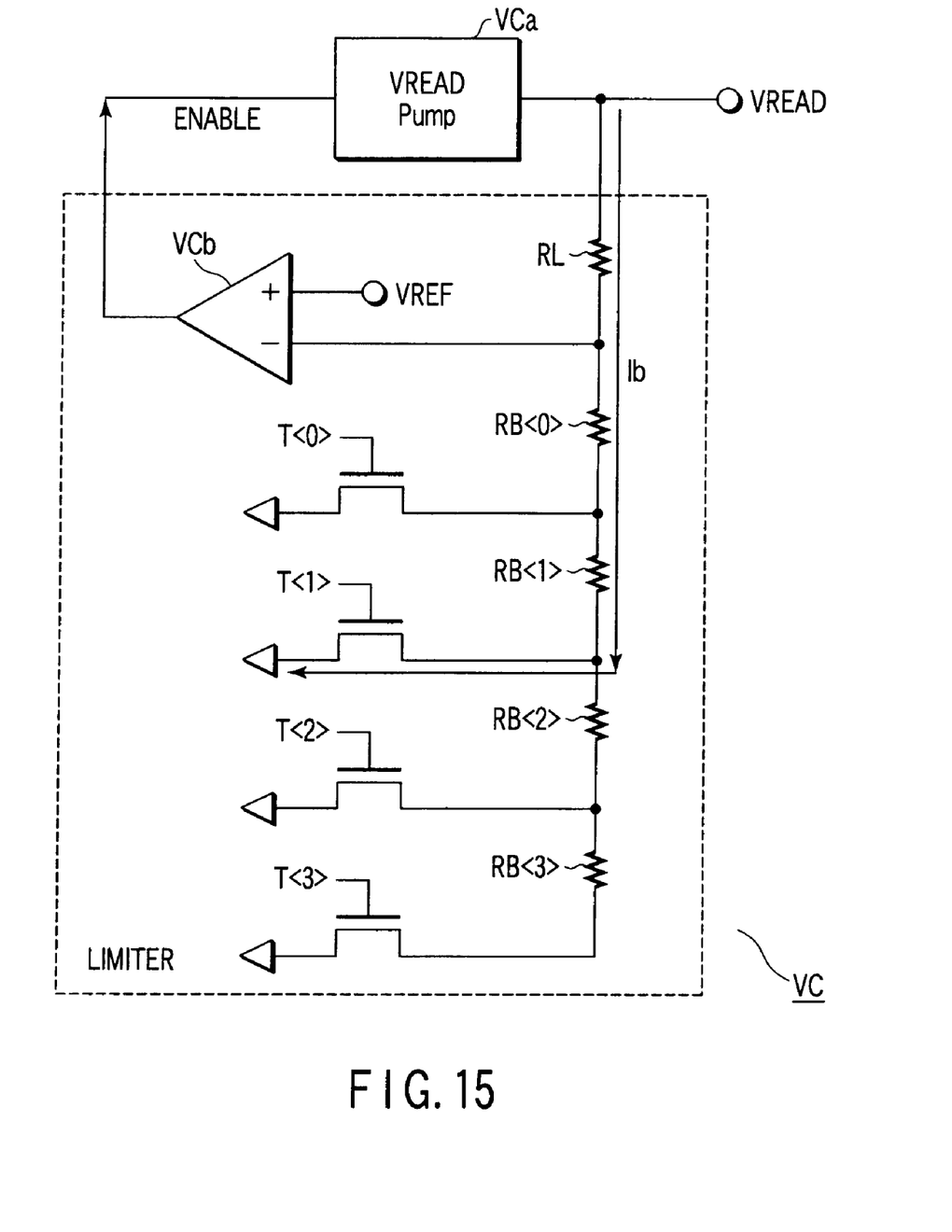
FIG. 15 is a circuit diagram showing the configuration of a VREAD output circuit according to the second embodiment of this invention.

FIG. 15 shows an example of the configuration of a VREAD output circuit (pump) that generates the voltage VREAD_pre of approximately 6V and voltage VREAD of approximately 7V. For example, the VREAD output circuit VC includes a VREAD pump VCa, differential amplifier VCb, voltage selection switches T<0> to T<3> and resistance elements RL, RB<0> to RB<3>. The VREAD output circuit VC is configured to generate voltages VREAD of four patterns by selectively switching the voltage selection switches T<0> to T<3>.

For example, it is assumed that the resistance of the resistance element RL is 380 kΩ, the resistance of the resistance element RB<0> is 67.1 kΩ, the resistance of the resistance element RB<1> is 11.6 kΩ, the resistance of the resistance element RB<2> is 16.4 kΩ, the resistance of the resistance element RB<3> is 25.0 kΩ and the reference voltage VREF is 1.2V. Then, the voltage VREAD is given by the following equations (1), (2).

$$Ib = VREF \Big/ \left( \sum_{m=0}^{m=n} RB<m> \right) (n: \text{Selection switch } T<n> \text{ number}) \quad (1)$$

$$VREAD = VREF + RL*Ib = VREF * \left( 1 + RL \Big/ \sum_{m=0}^{m=n} RB<n> \right) \quad (2)$$

That is, a voltage of 5V is output from the VREAD pump VCa as the voltage VREAD when the voltage selection switch T<0> is turned ON, a voltage VREAD of 6V is output when the voltage selection switch T<1> is turned ON, a voltage VREAD of 7V is output when the voltage selection switch T<2> is turned ON and a voltage VREAD of 8V is output when the voltage selection switch T<3> is turned ON, respectively.

According to the present embodiment, occurrence of a read disturb at the read time for the cell with the negative threshold voltage can be alleviated by adding a simple circuit. That is, at timing t1, the voltage selection switch T<1> of the VREAD output circuit VC is turned ON to output a voltage VREAD of 6V (VREAD_pre), and at timing t2, the voltage selection switch T<2> is turned ON to output a voltage VREAD of 7V. Thus, occurrence of read disturb in the entire bit line selection sense system can be alleviated by precharging the non-selected word lines WL in the two separate steps at the read time for the cell with the negative threshold voltage.

In each of the above embodiments, a case wherein the NAND flash memory of the entire bit line selection sense system is used as an example is explained. However, this invention is not limited to this case and, for example, this invention can be applied to a NAND flash memory of a bit line shield system.

Figure 16:
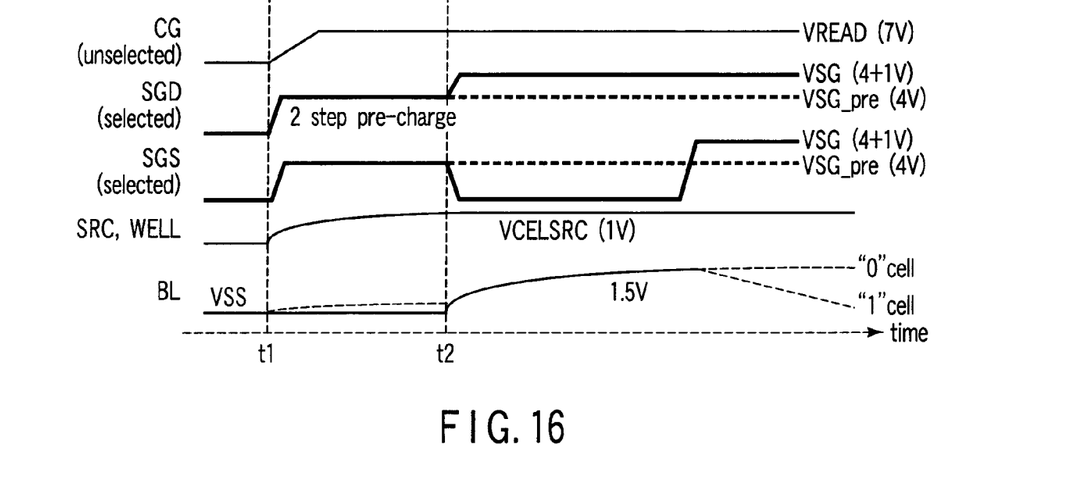
FIG. 16 is a timing chart for illustrating an operation associated with the read and verify operations for a cell with a negative threshold voltage by taking a NAND flash memory of a bit line shield system as an example.

FIG. 16 illustrates an operation associated with the read and verify operations for the cell with the negative threshold voltage by taking the NAND flash memory of the bit line shield system as an example. In the case of the bit line shield system, the selection transistors SGTD, SGTS are precharged in at least two separate steps. However, in this case, the VSG bias circuit 31 once lowers only the voltage of the selection signal line SGS to voltage VSS at timing t2. After this, in order to set the voltage of the selection signal line SGS to a final level, the two-step precharge operation is performed to raise the voltage of the selection signal line SGS by use of a select gate voltage VSG of approximately 5V obtained by adding the bias voltage (in this example, 1V) of the cell source line SRC and cell well line WELL.

Thus, even in the bit line shield system, the stable read and verify operations can be realized at the read and verify times for the cell with the negative threshold voltage.

Further, in each of the above embodiments, the operation of controlling the select gate voltage VSG in the read and verify operations for the cell with the negative threshold voltage is not limited to a case wherein the selection transistors SGTD, SGTS are precharged in one step or in two separate steps. For example, it is possible to precharge the selection transistors SGTD, SGTS in three or more steps.

Further, this invention is not limited to the NAND flash memory and, for example, it can be applied to a NOR flash memory that stores multi-value data.

In addition, the operation of raising the selection signal lines SGD, SGS in the first step can be performed at the same time as or before the raising operation for the voltage of the cell source line SRC.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory device capable of reading and verifying a cell with a negative threshold voltage by biasing voltages of a source line and well line to a positive voltage, comprising:
a voltage control circuit which applies a select gate voltage obtained by adding the biased positive voltage to a voltage set at a read time of a cell with a positive threshold voltage to a select gate at a read time and verify time for the cell with the negative threshold voltage.

2. The nonvolatile semiconductor memory device according to claim 1, wherein the voltage control circuit raises the voltage of the select gate before the voltage of the source line is raised.

3. The nonvolatile semiconductor memory device according to claim 1, wherein the voltage control circuit raises the voltage of the select gate at the same time as the voltage of the source line is raised.

4. The nonvolatile semiconductor memory device according to claim 1, wherein the voltage control circuit raises the voltage of the select gate after the voltage of the source line is raised.

5. The nonvolatile semiconductor memory device according to claim 1, wherein the voltage control circuit raises the voltage of the select gate in at least two separate steps.

6. The nonvolatile semiconductor memory device according to claim 5, wherein the voltage control circuit raises the voltage of the select gate in the first step not after the voltage of the source line is raised and raises the voltage of the select gate in the second step after the voltage of the source line has been raised.

7. The nonvolatile semiconductor memory device according to claim 6, wherein the select gate voltage at a first-step raising time of the voltage of the select gate by the voltage control circuit is higher than an increment of the select gate voltage at a second-step raising time of the voltage of the select gate.

8. The nonvolatile semiconductor memory device according to claim 7, wherein the select gate voltage at the first-step raising time of the voltage of the select gate by the voltage control circuit is equal to the select gate voltage at the read time of the cell with the positive threshold voltage and an increment of the select gate voltage at the second-step raising time of the voltage of the select gate is equal to a biased positive voltage of the source line and well line.

9. The nonvolatile semiconductor memory device according to claim 1, which further comprises a word line voltage generation circuit which applies a word line voltage to non-selected word lines at the read time and verify time of the cell with the negative threshold voltage and in which the word line voltage generation circuit raises voltages of the non-selected word lines in at least two separate steps.

10. The nonvolatile semiconductor memory device according to claim 1, wherein the nonvolatile semiconductor memory device is a NAND flash memory of an entire bit line selection sense system.

11. The nonvolatile semiconductor memory device according to claim 1, wherein the nonvolatile semiconductor memory device is a NAND flash memory of a bit line shield system.

12. The nonvolatile semiconductor memory device according to claim 1, wherein the select gate includes a drain-side select gate and source-side select gate of the cell with the negative threshold voltage and the voltage control circuit simultaneously raises voltages of the drain-side select gate and source-side select gate.

13. A nonvolatile semiconductor memory device capable of reading and verifying a cell with a negative threshold voltage by biasing voltages of a source line and well line to a positive voltage, comprising:
a voltage control circuit which applies a select gate voltage obtained by adding the biased positive voltage to a voltage set at a read time of a cell with a positive threshold voltage to a select gate at a read time and verify time for the cell with the negative threshold voltage,
wherein the voltage control circuit raises the voltage of the select gate in at least two separate steps.

14. The nonvolatile semiconductor memory device according to claim 13, wherein the voltage control circuit performs a first-step raising operation for the voltage of the select gate not after the voltage of the source line is raised and performs a second-step raising operation for the voltage of the select gate after the voltage of the source line has been raised.

15. The nonvolatile semiconductor memory device according to claim 14, wherein a select gate voltage at a first-step raising time of the voltage of the select gate by the voltage control circuit is higher than an increment of the select gate voltage at a second-step raising time of the voltage of the select gate.

16. The nonvolatile semiconductor memory device according to claim 15, wherein the select gate voltage at the first-step raising time of the voltage of the select gate by the voltage control circuit is equal to the select gate voltage at the read time of the cell with the positive threshold voltage and an increment of the select gate voltage at the second-step raising time of the voltage of the select gate is equal to a biased positive voltage of the source line and well line.

17. The nonvolatile semiconductor memory device according to claim 13, which further comprises a word line voltage generation circuit which applies word line voltage to non-selected word lines at the read time and verify time of the cell with the negative threshold voltage and in which the word line voltage generation circuit raises voltages of the non-selected word lines in at least two separate steps.

18. The nonvolatile semiconductor memory device according to claim 13, wherein the nonvolatile semiconductor memory device is a NAND flash memory of an entire bit line selection sense system.

19. The nonvolatile semiconductor memory device according to claim 13, wherein the nonvolatile semiconductor memory device is a NAND flash memory of a bit line shield system.

20. The nonvolatile semiconductor memory device according to claim 13, wherein the select gate includes a drain-side select gate and source-side select gate of the cell with the negative threshold voltage and the voltage control circuit simultaneously raises voltages of the drain-side select gate and source-side select gate.

* * * * *